(12) United States Patent
Wright

(10) Patent No.: US 7,320,903 B2
(45) Date of Patent: Jan. 22, 2008

(54) APPARATUS FOR AND METHOD OF PACKAGING SEMICONDUCTOR DEVICES

(75) Inventor: Lance Cole Wright, Van Alstyne, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/263,618

(22) Filed: Nov. 1, 2005

(65) Prior Publication Data

US 2006/0055026 A1    Mar. 16, 2006

Related U.S. Application Data

(62) Division of application No. 10/789,645, filed on Mar. 1, 2004, now Pat. No. 6,977,191, which is a division of application No. 10/035,527, filed on Dec. 29, 2001, now Pat. No. 6,774,485.

(51) Int. Cl.
   *H01L 21/00* (2006.01)
(52) U.S. Cl. .................................................. 438/123
(58) Field of Classification Search ................ 257/783; 438/123
See application file for complete search history.

(56) References Cited

U.S. PATENT DOCUMENTS

| | | | |
|---|---|---|---|
| 4,456,359 A | 6/1984 | Turner | 354/312 |
| 5,427,492 A | 6/1995 | Tanaka et al. | 414/414 |
| 5,848,702 A | 12/1998 | Pakeriasamy | 206/725 |
| 6,273,310 B1 | 8/2001 | Gregory | 224/275 |
| 6,426,564 B1* | 7/2002 | Ball | 257/783 |

* cited by examiner

*Primary Examiner*—Carl Whitehead, Jr.
*Assistant Examiner*—Monica D. Harrison
(74) *Attorney, Agent, or Firm*—Yingsheng Tung; Wade James Brady, III; Frederick J. Telecky, Jr.

(57) ABSTRACT

A carrier and package for plural semiconductor devices includes a member with device-conformal apertures therethrough. A first removable cover is attached to one side of the member to close one end of each aperture. After devices are inserted into the apertures with their first ends "up" and their second ends "down," a second removable cover is attached to the other side of the member to close the other end of each aperture. After inverting the assembly, removal of the first cover presents the devices in the apertures with their second ends "up" and their first ends "down."

4 Claims, 2 Drawing Sheets

APPARATUS FOR AND METHOD OF PACKAGING SEMICONDUCTOR DEVICES

This application is a division of Ser. No. 10/789,645, filed Mar. 1, 2004, now U.S. Pat. No. 6,977,191, which is a division of Ser. No. 10/035,527, filed Dec. 29, 2001 now U.S. Pat. No. 6,774,845.

FIELD OF THE INVENTION

The present relates to apparatus for and a method of packaging semiconductors devices, and, more particularly, to a packaging apparatus and methods for plural devices which are manufactured and then placed in a package in a first orientation, but which customers to whom the packages are furnished desire to remove from the package in a different orientation.

BACKGROUND OF THE INVENTION

One type of prior art semiconductor device is a ball grid array ("BGA") device 10, generally depicted in FIG. 1. A BGA device 10 typically includes a substrate 12 carrying electrical conductive paths 14 and 16 on opposed surfaces 18 and 20 thereof, and electrical paths 22 formed within through-holes 24 through the substrate 12. The surface 18 of the substrate 12 also carries a semiconductor chip 30 that includes thereon and therein a variety of transistors and other devices.

The transistors and other devices of the chip 30 are rendered electrically continuous with selected ones of the paths 14 by wires 32 which are bonded to external transistor-connected pads on the chip 30 and selected paths 14. Selected paths 14 are connected to selected paths 16 via the through-hole paths 22. Eutectic solder balls 34 on the paths 16 permit the ultimate connection of the chip 30 to terminals or pads of utilization circuitry. The chip 30, the wires 32 and other portions of the device 10 may be covered with or encapsulated in insulative material 36 of selected formulations.

During and after the production of the BGA device 10, it is subjected to various visual, electrical and other inspections and tests. Ultimately, the completed device 10 is delivered to a packaging station, generally depicted by the reference numeral 38 in FIGS. 1 and 2, where the device 10 is packaged for delivery to and use by a customer.

The bonding of the wires 32, the encapsulation with the insulative material 36 and other operations utilized to produce the device 10 are typically carried out so that when the completed device 10 arrives at the packaging station 38, a first or upper surface 40 of the device 10 is oriented upwardly, while a second or lower surface 42 of the device 10 is oriented downwardly. This positioning of the device 10 orients the balls 34 downwardly.

Typically, and referring now to FIG. 2, large numbers of devices 10 are continuously delivered to the packaging station 38 oriented with their balls 34 down. Selected quantities of the devices 10 are then conveniently placed into multiple pockets 48, one device 10 per pocket 48, formed in a tray 50, sometimes referred to as a waffle pack, with their balls 34 down. A cover 52 may then be placed over and removably secured to the waffle pack 50 to retain the devices 10 therein. The waffle pack 50 and the contained devices 10 are then shipped to a customer.

Customers object to receiving the devices 10 in the waffle packs 50 ball-side-down. One reason for this objection is that customers' utilization of the devices—typically removal from the waffle pack 50 and placement in and connection to other circuitry—requires that the devices 10 be ball-side-up. Absent intervention by the device manufacturer, a customer must invert each device 10 into a ball-side-up orientation after its removal from the waffle pack 50.

Prior manufacturer intervention in this area has taken the following form: After a quantity of devices 10 have been loaded into an uncovered waffle pack 50, a second inverted waffle pack 52 is placed and held thereover so that the pockets 48 in each waffle pack 50,52 are aligned. At this point, the waffle pack 50 is below the superjacent waffle pack 52. The waffle pack 50,52 "sandwich" is then inverted reversing the upper and lower positions of the waffle packs 50,52 so that the waffle pack 50 originally holding the devices is now upside-down. This inversion allows the devices 10 to fall from the pockets 48 of the waffle pack 50 ball-side-up into the pockets 48 of the now lowermost, right-side-up waffle pack 52. The waffle pack 52 is then covered and shipped to a customer, who is able, as desired, to remove the devices 10 therefrom ball-side-up.

Typically, waffle packs 50,52 for BGA devices 10 contain numerous pockets. Aligning these pockets in the waffle packs 50,52 can be difficult and time-consuming. It is likely that some of the devices 10 will not drop into the pockets 48 of the waffle pack 52 upon inversion of the packs 50,52 because of misalignment of the pockets 48,48 or because of a device 10 "cocking" in the pockets 48 of one or the other pack 50,52. It has also been found that the application of force to the packs 50,52 during the inversion—such as may occur when the packs 50,52 are tapped to encourage the devices 10 to fall or due to the impact of the devices 10 against the pockets 48 in the pack 52 incident to falling—may damage the devices 10.

One aim of the present invention is the provision of a method and apparatus which simplify orienting devices 10 according to customers' wishes, which method and apparatus obviate the shortcomings of the prior method.

SUMMARY OF THE INVENTION

The premise for the method and apparatus of the present invention is that articles, which may be BGA semiconductor devices or the like, are presented at a work station, such as a packaging station, in a certain orientation that is caused by or results from prior operations such as manufacturing or testing. In the case where the article is a BGA device, the orientation at the work station results in ball contacts thereon being downward, that is, the devices are presented to the station ball-side-down. It is desired to present multiple articles to customers in a pocketed container in a different or inverted orientation, in the case of the BGA devices ball-side-up. Further, it is desired to achieve inversion of the articles without dropping the articles from a first container into a second aligned container by inverting the two containers so the articles drop from the first to the second container in an inverted orientation.

Instead of using a pocketed container at the work station, a member or transfer body is secured which has apertures formed therethrough, that is, all the way through the member as open apertures. The apertures are conformal with the periphery of the articles so that once an article is therein, it cannot rotate and is securely held therein. One end of the apertures is closed to render them blind apertures. Conveniently this may be achieved by fixing a first removable cover to the side of the member at which the ends of the apertures are located.

Next, the articles are inserted into the apertures at the work station, using, in effect, the first removable cover as a "bottom" against which the articles abut. In the case of BGA devices, the balls thereof abut and are supported by the first cover and the opposed surface of the BGA devices are exposed at the work station. Now the other ends of the blind apertures are closed, conveniently be a second removable cover. This renders the apertures closed apertures. Thereafter, the member is inverted. This inverts the articles converting the first cover into a "top" cover and the second cover a "base" which supports the devices in their inverted orientation. This inverted orientation in the case of BGA devices is ball-side-up. Removal of the first cover, now the "top" cover, exposes the inverted articles, specifically the BGA device balls, the orientation preferred by customers.

DETAILED DESCRIPTION

Figure 1:
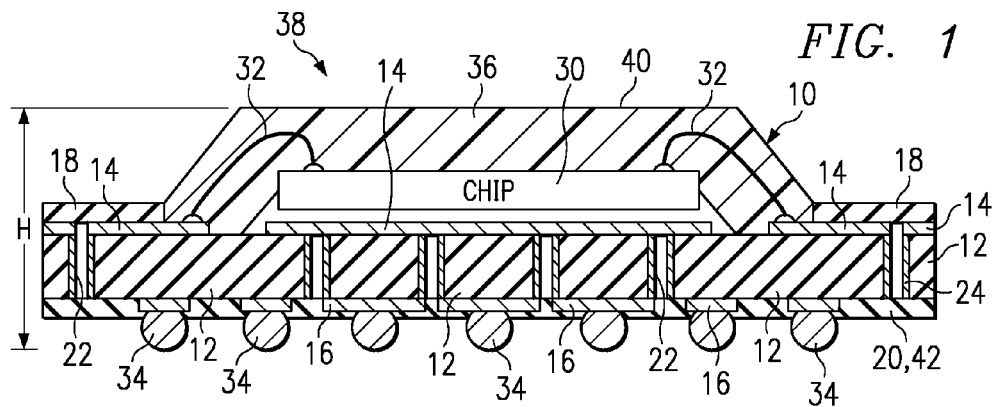
FIG. 1 is a generalized of a preferred article as to which the present invention is applicable, specifically a BGA semiconductor device.
Figure 2:
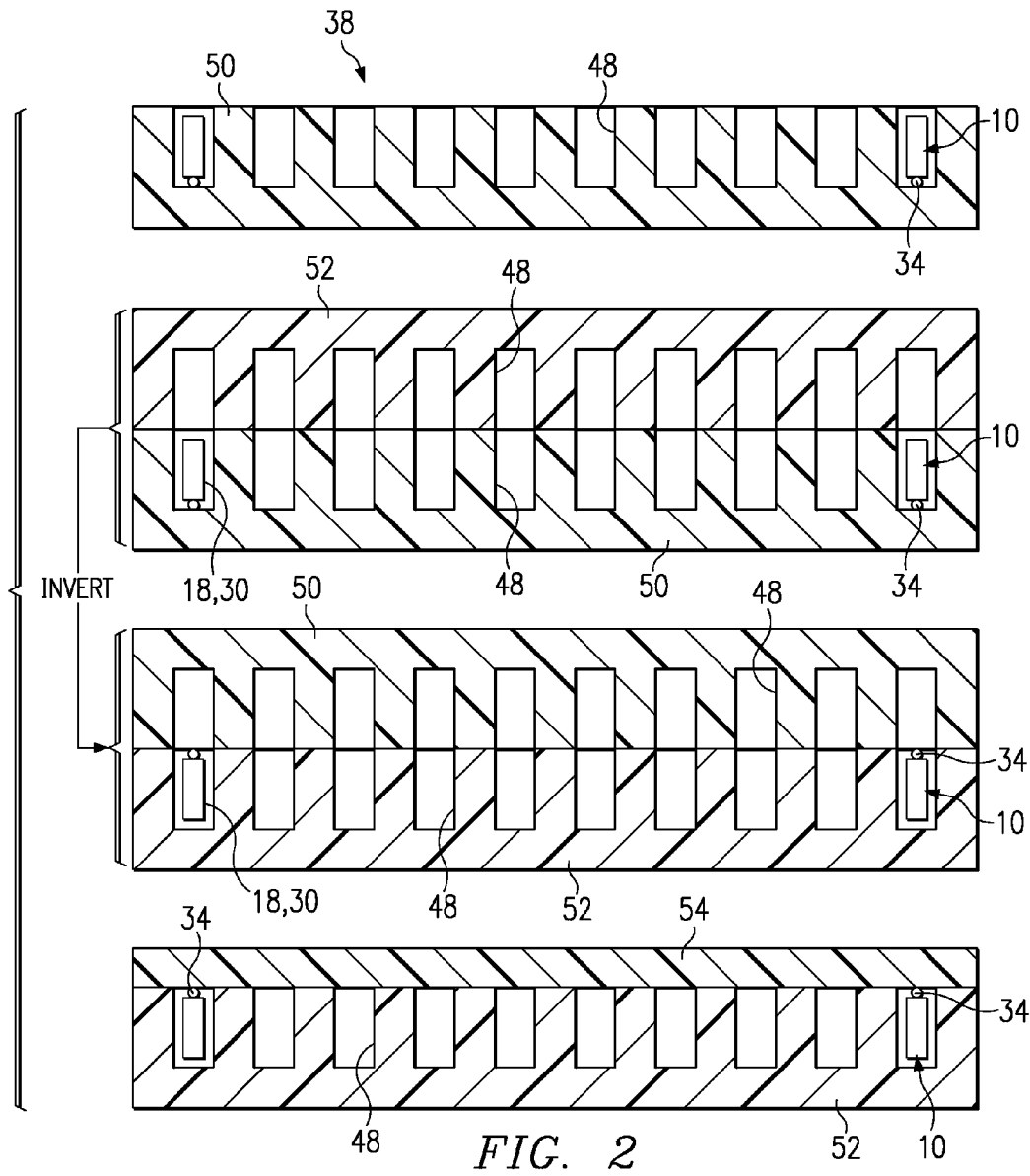
FIG. 2 is a depiction of the prior art method and apparatus used at a packaging station and which is superseded by the method and apparatus of the present invention.

Referring again to FIGS. 1 and 2, there are shown a BGA device 10, as previously described and a generalized depiction of a prior art method of packaging numerous devices for shipment. As noted above, it is premised that, according to the prior art, the devices 10 are presented at a packaging station 38 ball-side-down and are, in this orientation, placed into a waffle pack 50 and are also shipped, in this orientation, to customers who prefer to have the devices 10 presented ball-side-up.

Figure 3:
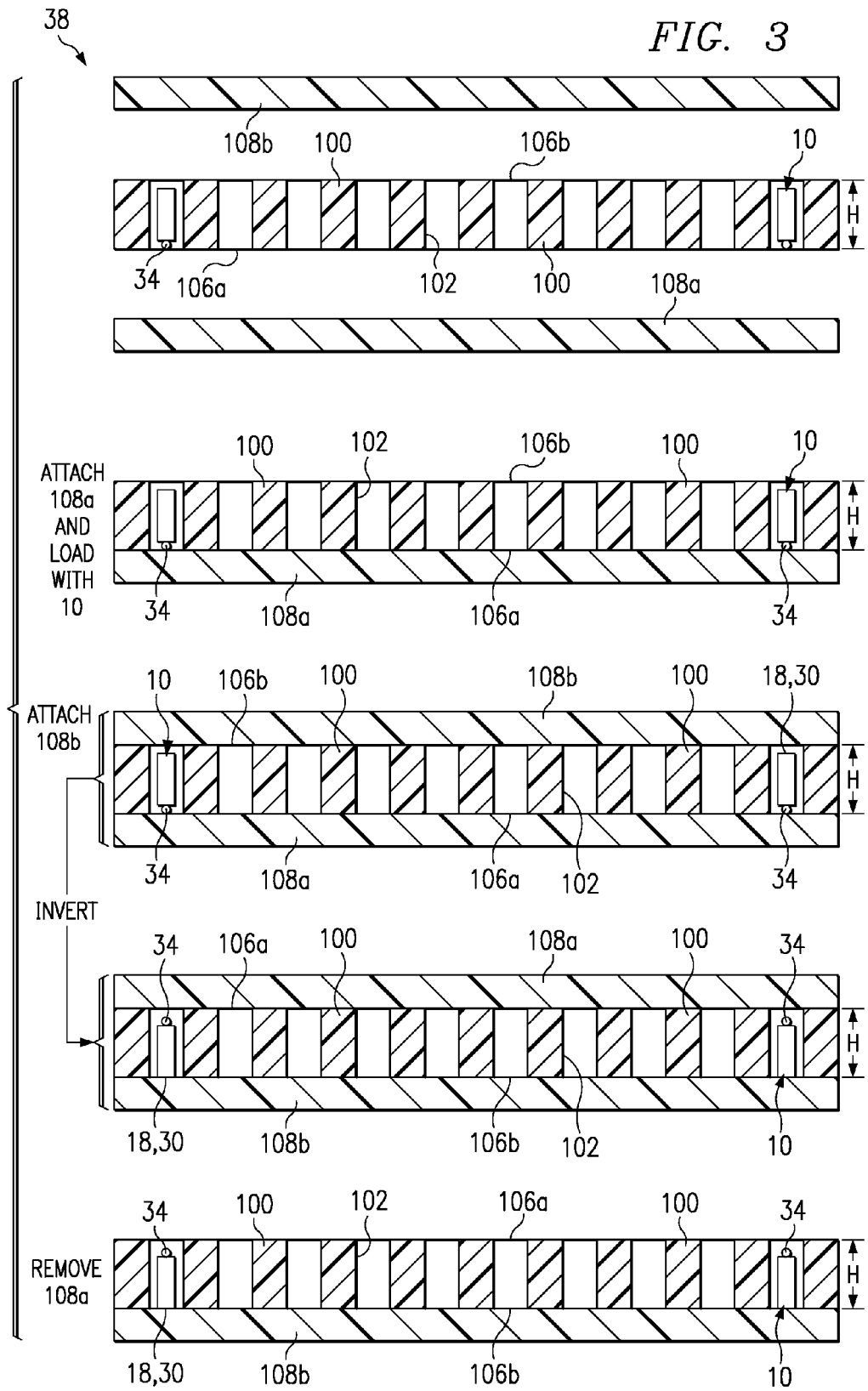
FIG. 3 contains three views which illustrate the method and apparatus of the present invention which permit re-orientation of the article shown in FIG. 1 at a packaging or similar station.

Referring now to FIG. 3 the apparatus and method of the present invention are depicted.

The apparatus of the present invention comprises a generally planar transfer body 100 or other planar member having one or more—preferably plural—apertures 102 formed therethrough. Preferably, the walls of the apertures 102 are conformal to the periphery 104 of the devices 10 so that once a device 10 has been inserted into an aperture 102 the orientation of the device 10 is fixed and cannot change in, and parallel to, the plane of the transfer body 100. The length of the apertures 102 between the surfaces 106a and 106b of the member 100 is substantially equal to the height H of the device 10. The mutual spacing and pattern of the apertures 100 mimics that of the pockets 48 in the prior art waffle pack 50.

The apparatus also includes two similar covers 108a and 108b. The covers 108 may be removably secured or attached to respective surfaces 106a and 106b of the member 100. Each cover 108 has a configuration that results in its covering and closing all of the apertures 102 at one terminus or end thereof when the cover 108 is secured to the member 100.

In using the apparatus of the present invention to practice the method thereof, one of the covers 108a is removably secured to one surface 106a of the member 100, thereby closing on end of all the apertures 102, thus rendering them blind apertures 102. For the time being, the cover 108a serves as a "bottom" for the member-cover combination 100-108a, which in structure and function is the equivalent of the prior art opened waffle pack 50. As the finished devices 10 are directed to the packaging station 38, they are loaded into the now blind apertures 102 ball-side-down until the balls 34 of each device rest on or are supported by the cover 108a.

Thereafter, the other cover 108b is removably secured to the other surface 106b of the member 100, thus closing the apertures 102. As noted earlier, due to the dimension H of the devices 10 relative to the length of the apertures 102, there will be little if any space between the upper surface 18 of the devices 10 and the cover 108b.

The top-to-bottom orientation of the cover-member-cover combination 108b-100-108a is then changed to reverse in space the positions formerly occupied by the balls 34 and the upper surface 18 of the devices 10. Typically, this may be achieved by simply inverting or turning over—i.e., effectively rotating about a horizontal axis—the combination 108b-100-108a so that the cover 108b is lowermost, the cover 108a is uppermost, the surface 18 of the devices now rests on the cover 108a, and the balls 34 are uppermost in the apertures 102 with little if any spacing between them and the cover 108a.

Thereafter, the combination 108b-100-108a, as viewed from top to bottom functions as a prior art waffle pack 50. Removal of the cover 108b, now on "top" of the novel pack 108b-100-108a, presents the devices 10 ball-side-up, as desired by customers. To preclude removal of the cover 108a, which action will present the devices 10 in the undesirable ball-side-down orientation, tape or a sealant may fix the cover 108a to the member 100, the former being preferred if the apparatus 100/108 is to be reused. Legends may also be affixed to the pack 108b-100-108a informing which cover 108b is the "top" and which cover 108a is the "bottom."

It should be clear that although words such as "invert," "top," "bottom," "up," and "down" are used herein, the apparatus and method of the present invention may be used in any original or final orientation—not necessarily horizontal—to reverse which end or portion of an article is presented to a work station or other location. In one extreme, the articles 10 may be inserted at the work station into the apertures 102 with the member 100 vertically oriented and one cover 108a secured thereto, followed by securing the other cover 108b, rotation of the pack 108a-100-108b about a vertical axis, and opening of the cover 108a at the work station. This latter technique "inverts" or reverses the ends of the articles in a left to right sense rather than a top to bottom sense.

The various aspects of the present invention described above are intended to be exemplary only, the scope of the present invention to be determined from the following claims broadly interpreted to include disclosed and equivalent aspects.

What is claimed is:

1. A method of packaging a BGA semiconductor device having first and second opposed surfaces both of which are generally normal to the device's periphery, a first surface of the device carrying an array of contact balls, which comprises:

closing one end of a device-periphery-conformal aperture formed through a member to render the aperture a blind aperture;

inserting the device into the blind aperture so that the balls on the first article surface are supported at the blind end of the aperture and its second surface is unsupported and exposed;

closing the other end of the aperture to render the aperture a closed aperture; and manipulating the member and thereafter opening the one end of the closed aperture with the second surface of the device supported to expose the first device surface with the balls thereon.

2. A method as in claim 1, wherein:

the member has plural apertures formed therethrough, one or more of which apertures may contain a BGA device, the one end closing step simultaneously closes the one end of each aperture, the other end closing step simultaneously closes the other end of each aperture, and the one end opening step simultaneously opens the one end of each aperture to simultaneously expose the first device surfaces and the balls thereon.

3. A method as in claim 1, which further comprises:

manipulating the member so that the second surface of the device is supported within the closed aperture and the first surface is unsupported, and after manipulation, opening the one end of the closed aperture exposes the first device surface and the balls thereon.

4. A method as in claim 3, wherein:

the member has plural apertures formed therethrough, one or more of which apertures may contain a BGA device, the one end closing step simultaneously closes the one end of each aperture, the other end closing step simultaneously closes the other end of each aperture, and the one end opening step simultaneously opens the one end of each aperture to simultaneously expose the first device surfaces and the balls thereon.

* * * * *